United States Patent [19]

Teunisse

[11] Patent Number: 5,724,012
[45] Date of Patent: Mar. 3, 1998

[54] TRANSMISSION-LINE NETWORK

[75] Inventor: Petrus Johannus Stephanus Teunisse, Hengelo, Netherlands

[73] Assignee: Hollandse Signaalapparaten B.V., Hengelo, Netherlands

[21] Appl. No.: 682,630

[22] PCT Filed: Jan. 18, 1995

[86] PCT No.: PCT/EP95/00179

§ 371 Date: Aug. 1, 1996

§ 102(e) Date: Aug. 1, 1996

[87] PCT Pub. No.: WO95/21472

PCT Pub. Date: Aug. 10, 1995

[30] Foreign Application Priority Data

Feb. 3, 1994 [NL] Netherlands ................ 9400165

[51] Int. Cl.⁶ ........................................... H01P 3/08
[52] U.S. Cl. ................................. 333/238; 333/244
[58] Field of Search ................................. 333/238

[56] References Cited

U.S. PATENT DOCUMENTS 2,800,634  7/1957  Grieg et al. ................ 333/238
3,768,048  10/1973  Jones, Jr. et al. .......... 333/238

FOREIGN PATENT DOCUMENTS 217114  10/1989  United Kingdom.
2232822  12/1990  United Kingdom ........... 333/238

OTHER PUBLICATIONS

Schneider, *Microstrip Lines for Microwave Integrated Circuits*, The Bell System Technical Journal, vol. 48, No. 5, May–Jun. 1969, pp. 1421–1424.

*Primary Examiner*—Paul Gensler
*Attorney, Agent, or Firm*—Oblon, Spivak, McClelland, Maier & Neustadt, P.C.

[57] ABSTRACT

Transmission-line network of the foam stripline type. To reduce dielectric losses in the foam, part of the foam in the region of the stripline is removed so that the wave properties of the transmission-line network are not impaired. The removed foam forms ducts that may be used for the forced cooling of the stripline using air or other cooling agents.

16 Claims, 1 Drawing Sheet

TRANSMISSION-LINE NETWORK

FIELD OF THE INVENTION

The invention relates to a transmission-line network, comprising an assembly of a first conductive base, a first dielectric sheet having a constant thickness, a second dielectric sheet having a constant thickness, a second conductive base, and a stripline network, located between the first dielectric sheet and the second dielectric sheet. Such transmission-line networks are for instance used as distribution networks in phased array or multibeam antennas. A drawback of these well-known transmission-line networks is their relatively limited capability for power transmission owing to heat developing in the dielectric sheets near the inner conductor structure as a result of dielectric losses, which could cause excessive heating of the transmission-line network.

DISCUSSION OF THE BACKGROUND

An improved transmission-line structure is known from GB-A 2.217.114, where the stripline network is located in a groove in one dielectric sheet, such that one side of the stripline network is free of dielectric. For high power applications this known transmission-line structure has as a disadvantage that one side of the stripline network still contains dielectric, which may give rise to overheating, especially as the electromagnetic fields tend to concentrate on the side containing dielectric.

For a distribution network the known transmission-line structure has moreover as a disadvantage that the stripline network is not symmetric in the sense that the speed for electromagnetic waves is different for the side with the dielectric, compared with the side without dielectric. This implies that the phase lengths of stripline parts are not well-defined, which is unacceptable in a distribution network.

SUMMARY OF THE INVENTION

The present invention has for its object to realize a transmission-line network that does not experience these drawbacks and is characterized in that for at least part of the stripline network both dielectric sheets are provided with a cavity whose form conforms at least substantially to that part of the stripline network, such that for that part the transmission line network contains at least substantially no dielectric.

For supporting the stripline network, a first favourable embodiment is characterized in that the width of the cavity has at least locally been selected for being smaller than the width of the stripline network. Thus, the volume of dielectric that will cause the occurrence of dielectric losses will be strongly reduced, any remaining dielectric only being present on the edge of the inner conductor structure where the occurring electric field strengths and, consequently, the occurring dielectric losses will usually be smaller. Moreover, it will generally not be required to support the inner conductor structure over its entire length as a result of which, in those regions where support is desired, the presence of a limited volume of dielectric between the inner conductor structure and the first and the second conductive base, may suffice.

In a second exceptionally favourable embodiment the stripline network can be placed on a dielectric film, which is placed between the first and the second dielectric sheet. It will then be possible to select the width of the cavity to be larger than the width of the stripline, resulting in the complete elimination of dielectric losses occurring in the dielectric sheet.

This entails the additional advantage that the stripline network can be implemented as a printed circuit placed on the dielectric film. It furthermore enables complex inner conductor structures to be manufactured at relatively low cost.

Transmission-line networks thus obtained are capable of high-power transmission, the ohmic losses in the inner conductor structure and dielectric losses occurring in the dielectric film constituting the restrictive factors. By for instance using KAPTON or polyamide, these dielectric losses can be kept low.

An additional advantage of the invention is that the power to be transmitted can be further increased by cooling the inner conductor structure. A further favourable embodiment of the invention is thereto characterized in that means have been provided for the supply of a fluid flow along at least a part of the stripline network for cooling the network. For this purpose, additional cavities may be provided in a dielectric sheet. The use of dry air as fluid flow also prevents moisture from penetrating into the transmission-line network; this moisture might give rise to further losses.

This is particularly relevant if the dielectric sheet is made of synthetic foam that is noted for its absorptive capacity.

The invention will now be explained in more detail with reference to the following figures, of which:

FIG. 1 schematically represents a top view of a transmission-line network;

Figure 1:
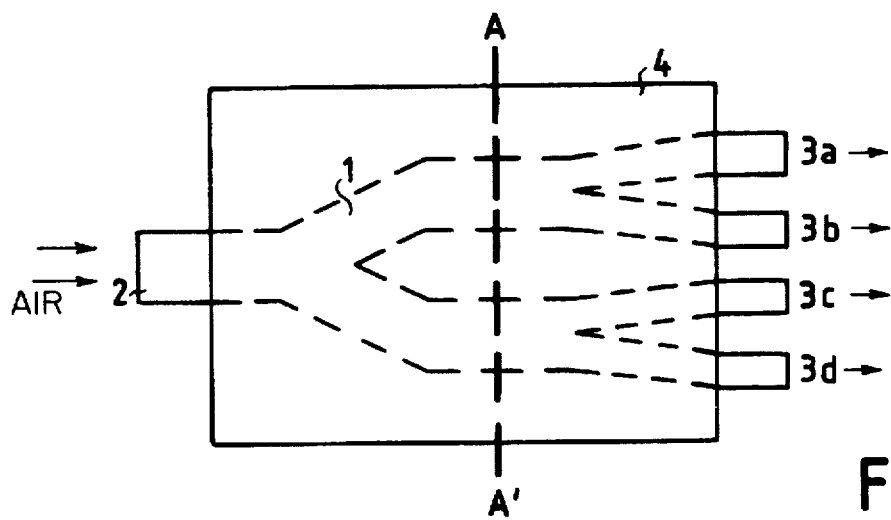

FIG. 1 schematically presents a top view of a transmission-line network, provided with an inner conductor structure 1. It can for instance be used for the distribution of microwave energy supplied to input 2 over the four outputs 3a, 3b, 3c and 3d. Such transmission-line networks are frequently applied in for instance antennas, with a transmitter or a receiver being connected to input 2 and radiating elements to the outputs 3a, 3b, 3c and 3d. Inner conductor structure 1 will generally be a stripline network contained in a sandwich structure 4 that will be further described below.

Figure 2:
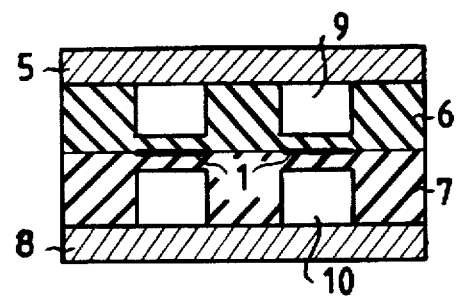
FIG. 2 represents a cross-section of a first embodiment of a transmission-line network according to the invention.

In accordance with the line AA' shown in FIG. 1, FIG. 2 represents a cross-section of a possible structure of a transmission-line network according to the invention. Inner conductor structure 1 is sandwiched between a first conductive base 5, a first dielectric sheet 6, a second dielectric sheet 7 and a second conductive base 8. To prevent dielectric losses, the dielectric near the inner conductor structure i has been partly removed by means of cavities 9 and 10 provided in the first dielectric sheet 6 and the second dielectric sheet 7 respectively. The cavities 9 and 10 are such that they faithfully conform to the form of the inner conductor structure i as shown in FIG. 1, while still maintaining a sufficient support for the inner conductor structure 1. It should also be noted that inner conductor structure 1 normally has a far more complex form than is indicated in FIG. 1, which not only results from more complex functions having to be realized, but is also due to the incorporation of a variety of compensation structures for obtaining a large bandwidth.

Figure 3:
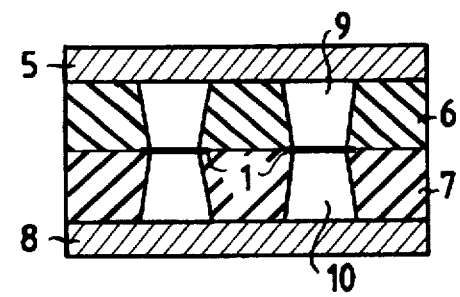
FIG. 3 represents a cross-section of a second embodiment of a transmission-line network according to the invention.

In accordance with the line AA' in FIG. 1, FIG. 3 also represents a cross-section of a further possible construction of a transmission-line network according to the invention. Cavities 9 and 10 are now bottomless, which means that inner conductor structure 1 is floating, except for the edges which are only just clamped between the first dielectric sheet 6 and the second dielectric sheet 7. By tapering the edges of cavities 6 and 7, as indicated in this figure, dielectric losses can be further reduced. This construction is particularly useful if the inner conductor structure 1 is light, for instance a thin stripline network. This may give rise to ohmic losses in inner conductor structure 1, although this can be countered by supplying sufficient cooling by for instance blowing cold air into the duct-shaped cavities 9 and 10 near input 2, the air being subsequently capable of escaping from outputs 3a, 3b, 3c and 3d. This can also be realised with more complex forms of inner conductor structure 1, for instance by means of additional cavities in dielectric sheet 6 and 7 specifically provided for the transport of a cooling fluid. Additional cavities are also necessary if the cavities 9 and 10 do not follow the entire inner conductor structure 1 but only a part of it, for example near input 2. When connected to a transmitter this part tends to develop problems to heating first.

Figure 4:
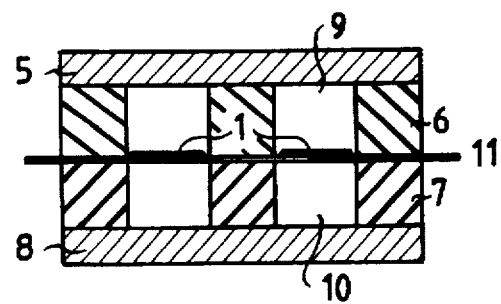
FIG. 4 represents a cross-section of a third embodiment of a transmission-line network according to the invention.

FIG. 4 also represents, in accordance with the line AA' in FIG. 1, a cross-section of a further possible construction of a transmission-line network according to the invention. Inner conductor structure 1 is implemented as a stripline network placed on a dielectric film 11, for instance as a printed circuit. This method has the advantage that also complex stripline networks can be manufactured at low cost. Cavities 9 and 10 can now even be wider than inner conductor structure 1 at that location, since support is provided by the dielectric film 11. Dielectric film 11 introduces dielectric losses, although these may be reduced through a suitable material selection such as KAPTON or glass-fibre reinforced polyamide. Also here it is possible to use the ducts formed by cavities 9 and 10 for cooling the inner conductor structure 1, including the dielectric film.

Although in said embodiments, the sandwich 4 has been represented as a planar structure, the invention can also be applied to curved surfaces, for instance for feeding a conformal antenna array.

I claim:

1. Transmission-line network, comprising an assembly of a first conductive base, a first dielectric sheet having a constant thickness, a second dielectric sheet having a constant thickness, a second conductive base, and a stripline network, located between the first dielectric sheet and the second dielectric sheet, characterized in that both dielectric sheets are provided with a continuous length cavity whose form conforms substantially to the stripline network, such that the transmission-line network contains substantially no dielectric sheet between the first conductive base and the stripline network and the second conductive base and the stripline network and that the stripline network is placed on a dielectric film, interposed between the first dielectric sheet and the second dielectric sheet.

2. Transmission-line network as claimed in claim 1, characterized in that, for supporting the stripline network the width of the cavity has at least locally been selected for being smaller than the width of the stripline network.

3. Transmission-line network as claimed in claim 2, characterized in that means have been provided for the supply of a fluid flow along at least a part of the stripline network for cooling the stripline network.

4. Transmission-line network as claimed in claim 2, characterized in that the dielectric sheets are made of a synthetic foam.

5. Transmission-line network as claimed in claim 1, characterized in that the stripline network contains a printed circuit placed on the dielectric film.

6. Transmission-line network as claimed in claim 5, characterized in that means have been provided for the supply of a fluid flow along at least a part of the stripline network for cooling the stripline network.

7. Transmission-line network as claimed in claim 5, characterized in that the dielectric sheets are made of a synthetic foam.

8. Transmission-line network as claimed in claim 5, characterized in that the dielectric film contains polyamide.

9. Transmission-line network as claimed in claim 8, characterized in that means have been provided for the supply of a fluid flow along at least a part of the stripline network for cooling the stripline network.

10. Transmission-line network as claimed in claim 8, characterized in that the dielectric sheets are made of a synthetic foam.

11. Transmission-line network as claimed in claim 1, characterized in that the dielectric film contains polyamide.

12. Transmission-line network as claimed in claim 11, characterized in that means have been provided for the supply of a fluid flow along at least a part of the stripline network for cooling the stripline network.

13. Transmission-line network as claimed in claim 11, characterized in that the dielectric sheets are made of a synthetic foam.

14. Transmission-line network as claimed in claim 1, characterized in that means have been provided for the supply of a fluid flow along at least a part of the stripline network for cooling the stripline network.

15. Transmission-line network as claimed in claim 14, characterized in that the dielectric sheets are made of a synthetic foam.

16. Transmission-line network as claimed in claim 1, characterized in that the dielectric sheets are made of a synthetic foam.

* * * * *